Figure 4:
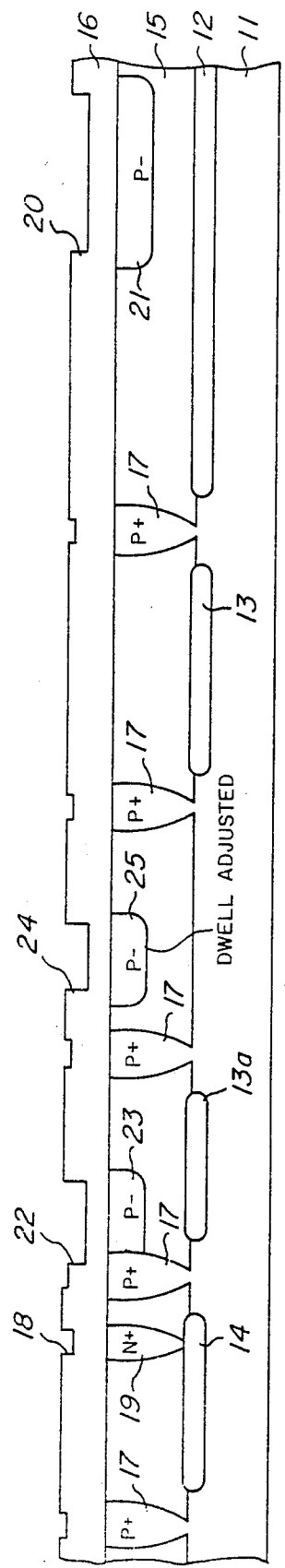

United States Patent [19]
Curran

[11] Patent Number: 4,546,370
[45] Date of Patent: Oct. 8, 1985

[54] MONOLITHIC INTEGRATION OF LOGIC, CONTROL AND HIGH VOLTAGE INTERFACE CIRCUITRY

[75] Inventor: Patrick A. Curran, Garland, Tex.

[73] Assignee: Texas Instruments Incorporated, Dallas, Tex.

[21] Appl. No.: 674,715

[22] Filed: Nov. 21, 1984

Related U.S. Application Data

[60] Continuation of Ser. No. 532,812, Sep. 15, 1983, , which is a continuation of Ser. No. 306,459, Sep. 28, 1981, , which is a division of Ser. No. 12,267, Feb. 15, 1979.

[51] Int. Cl.$^4$ .............................................. H01L 27/02
[52] U.S. Cl. ..................................... 357/43; 357/41; 357/48; 357/23.4
[58] Field of Search .................... 357/41, 43, 48, 23.4

[56] References Cited

U.S. PATENT DOCUMENTS

| | | | |
|---|---|---|---|
| 4,072,975 | 2/1978 | Ishitani | 357/23.4 |
| 4,229,756 | 10/1980 | Sato | 357/23.4 |
| 4,233,615 | 11/1980 | Takemoto | 357/43 |
| 4,402,003 | 8/1983 | Blanchard | 357/43 |
| 4,441,117 | 4/1984 | Zommer | 357/43 |

*Primary Examiner*—Martin H. Edlow
*Attorney, Agent, or Firm*—Richard A. Bachand; N. Rhys Merrett; Melvin Sharp

[57] ABSTRACT

Monolithic integration of digital logic circuitry, precision control circuitry, and high voltage interface circuits on the same semiconductor chip is achieved, using various combinations selected from D-MOS, vertical NPN, lateral NPN, PNP, P-MOS, N-MOS, and J-FET components. Cathode driver circuits for a plasma display panel are integrated with this technology. Other applications include automotive and television circuits.

5 Claims, 14 Drawing Figures

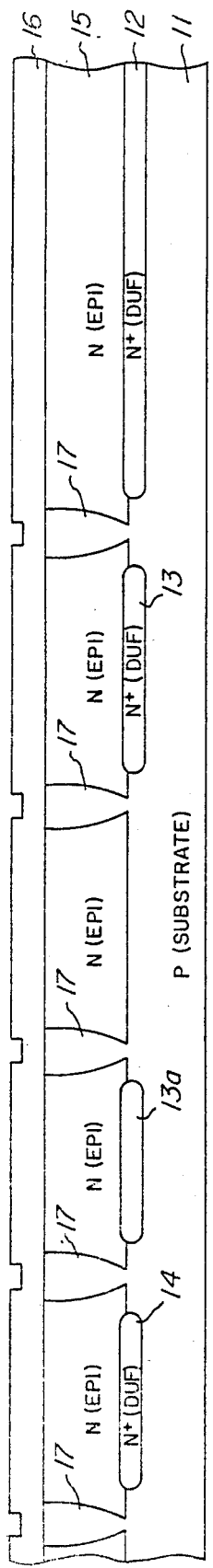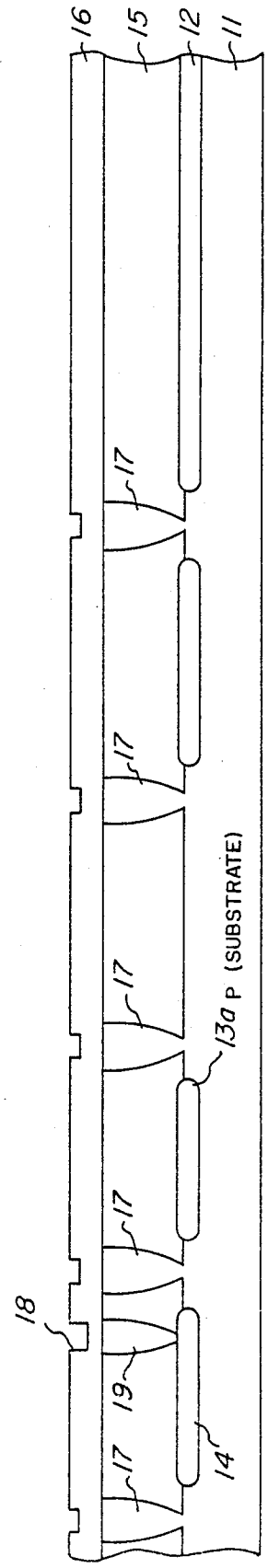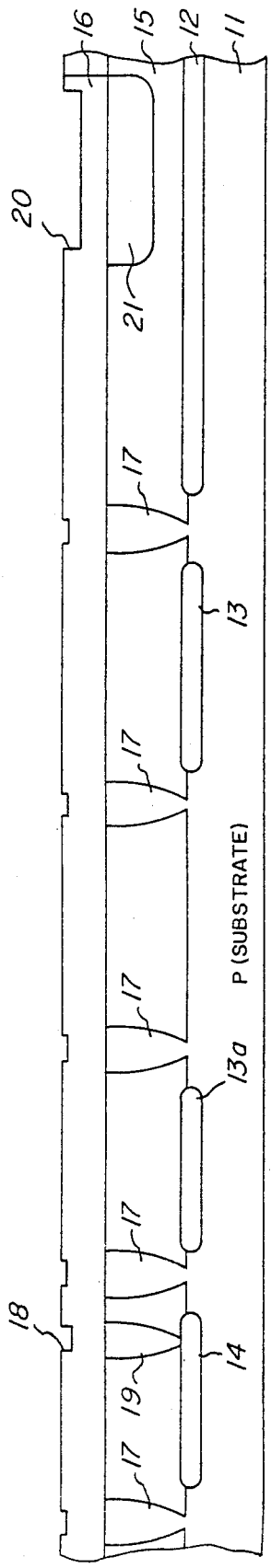

MONOLITHIC INTEGRATION OF LOGIC, CONTROL AND HIGH VOLTAGE INTERFACE CIRCUITRY

This application is a continuation of application Ser. No. 532,812, filed Sept. 15, 1983, which is a continuation of Ser. No. 306,459 filed Sept. 28, 1981, which is a division of Ser. No. 012,267, filed Feb. 15, 1979.

This invention relates to circuits and processes for the monolithic integration of vertical NPN, lateral NPN, lateral PNP, substrate PNP, PMOS, NMOS, DMOS, and J-FET components in such a configuration to form junction-isolated circuits operable at voltage levels above 100 volts. These processes permit the cost-effective fabrication of logic circuits, precision control circuitry, and high voltage interface circuitry on a single wafer. This approach significantly increases the level of integration, permitting analog and digital circuits on a single chip, and consequently improving electrical performance while achieving substantial cost reductions.

The invention includes several embodiments which combine bipolar technology with single- and double-diffused MOS structures. The disclosed embodiments use metal gate MOS components. The invention also includes the substitution of polysilicon gates and interconnects, which would provide high voltage field plates, MOS gates, floating gates and special memory structures, second level interconnects, and improved reliability through the control of localized electric fields.

One aspect of the invention is embodied in a process for the monolithic integration of a semiconductor circuit having double-diffused MOS (D-MOS) and vertical, high performance NPN components. An important concept of this invention is the compatible fabrication of high performance vertical bipolar and high performance double-diffused MOS components in a simultaneous environment. High performance implies independent control of component characteristics such as DC gain, threshold voltage, transconductance, parasitic capacitance, base depth and concentrations, breakdown voltages, etc. Processing begins by selectively forming an N+ region at the surface of a monocrystalline p-type semiconductor substrate, at each location where a vertical NPN component, and preferably where each DMOS component is to be fabricated. (Although the DMOS is a lateral component, the buried N+ layer serves to lower the distributed drain resistance of the drift region.) Next, an n-type surface layer is epitaxially grown on the substrate covering each n+ location. P+ regions are then selectively formed extending through the thickness of the epitaxial layer to provide pn junction isolation between components. A lightly doped p-type region (D-Well) is then selectively formed in the isolation portion of the epitaxial layer where DMOS components are to be fabricated. A medium-doped p-type region is then selectively formed at least partly within the lightly doped p-type region (D-Well) constituting the DMOS backgate contact; and concurrently a medium-doped p-type region is formed within the isolated portion of the epitaxial layer where the vertical NPN devices are to be fabricated, constituting the base region thereof. It is important to note that in this invention, the p-type region that defines the bulk channel (D-Well) is formed prior to the formation of the backgate/base diffusion; whereas this sequence is reversed in prior state-of-the-art DMOS fabrication. N-type regions are then selectively formed constituting the vertical NPN emitter, the NPN collector contact, and the DMOS source and drain, respectively. Gate oxide is then selectively formed on the DMOS channel region, followed by the selective removal of oxide to form contact vias, and finally, the circuit is completed using known metallization processes to form contacts and interconnects.

The surface dopant concentration resulting from the D-Well formation, is controlled such that the DMOS threshold voltage is determined by the intersection of the D-Well dopant concentration profile and the concentration profile of the subsequent n-type dopant which forms the NPN emitter, concurrently with the formation of DMOS source and drain. A significant feature of the process lies in the technique for preserving DMOS self-alignment while independently controlling NPN characteristics. As previously discussed, the bulk channel diffusion is performed followed by the NPN base diffusion, during which minimal oxide is grown in order to mask all p-type diffusions from subsequent n-type deposition. After the base diffusion, the patterning of the oxide is carried out in two stages by first selectively opening oxide windows for all n-type diffusion with oxide thicker than base oxide, followed by selective opening of windows for vertical NPN emitter and DMOS source. In patterning the DMOS source, oxide is removed over the bulk channel diffusion between the source and drift region as well as overlapping into the drift region. During the oxide removal, only sufficient oxide is removed so as to expose the bulk channel region; thus, oxide will only be fully removed where the original bulk channel oxide was removed and minimally regrown. Oxide will be partially removed over the lateral bulk channel diffusion and part of the drift region, but will still be thick enough to mask these regions from the subsequent DMOS source diffusion. Thus, the DMOS channel length is determined by the difference between the emitter diffusion and the D-Well diffusion, since the oxide window opened for the DMOS source diffusion or implantation is essentially the same window initially opened for D-Well formation.

From this sequence of steps it can be seen that the base diffusion is independent of the bulk channel diffusion. Thus, one can first choose the NPN base depth and subsequent emitter depth to yield the desired NPN characteristics. Knowing the emitter profile, the D-Well concentration and diffusion can be predetermined in order to obtain the desired DMOS characteristics. Thus, the above flow permits high performance lateral and vertical characteristics. In prior state-of-the-art, the base diffusion must be done prior to the bulk channel diffusion and must be necessarily deeper than the bulk channel diffusion. The DMOS source diffusion must be determined by the lateral characteristics and, therefore, does not permit independent base-to-emitter separation in that neither the base nor the emitter diffusion are independent of the bulk channel diffusion. Consequently, prior state-of-the-art DMOS does not lend itself to merged fabrication of bipolar and DMOS structures with high gain, high frequency NPN characteristics.

Another aspect of the invention is embodied in a process for the monolithic integration of a semiconductor circuit having D-MOS, P-MOS and N-MOS transistor components, beginning with the step of selectively forming an N+ region at the surface of a mono-crystalline p-type semiconductor substrate, at each location where one of said components is to be fabricated. A monocrystalline n-type semiconductor surface layer is then formed epitaxially on said substrate covering each of the device locations. P+ regions are then selectively formed in the epitaxial layer extending therethrough to provide p-n junction isolation between adjacent component regions. A first lightly-doped p-type surface region (N-Well) is then selectively formed in the isolated portion of said epitaxial layer where D-MOS components are to be fabricated. First, second and third medium-doped p-type regions are then selectively formed constituting the D-MOS backgate contact and the P-MOS source and drain regions, respectively. N-type regions are then formed selectively and concurrently, constituting the N-MOS source and drain, the D-MOS source and drain, and the P-MOS background contact, respectively. Gate insulation is then selectively formed over the channel region of each respective device.

The P-MOS enhancement threshold voltage is then adjusted by ion implantation. Boron ions are selectively implanted to form a depletion channel for the P-MOS devices. The circuit is then completed by selective oxide removal to form contact vias, followed by metallization and patterning, using known techniques.

In the above sequence, the surface dopant concentration achieved during D-Well formation is controlled to permit the threshold voltages of N-MOS and D-MOS components to be approximately equal.

Oxide growth over P-MOS and N-MOS regions is controlled to increase parasitic thick field N-MOS threshold, and thereby permit relatively thinner oxide growth over the D-Well channel regions. Preferably, sheet resistors are fabricated concurrently with N-Well fabrication, to provide sheet resistors having a resistance of at least 1,000 ohms per square.

Also, it is preferred to include concurrently with the D-MOS gate contact region the fabrication of additional p-type regions constituting the N-MOS background contact, N-MOS guard ring and sheet resistors.

A combination of the above two embodiments provides a third embodiment, whereby D-MOS, P-MOS, N-MOS and high performance vertical NPN transistor components are integrated on a single chip. The combination requires all the steps of the first embodiment (D-MOS plus NPN), and in addition requires (1) the formation of a first lightly-doped p-type region (N-Well) prior to formation of the D-Well; (2) the formation of P-MOS source and drain, and the N-MOS backgate and guard ring concurrently with the formation of the NPN base and the D-MOS backgate contact region; and (3) the formation of N-MOS source and drain and the P-MOS background contact concurrently with the NPN collector contact and emitter, and the D-MOS source and drain. Also, P-MOS enhancement threshold is adjusted, and P-MOS depletion channels formed, just prior to formation of contact viast and metallization.

A more comprehensive aspect of the invention is embodied in a process for the fabrication of a monolithic integrated microelectronic semiconductor circuit including vertical and lateral NPN transistors, P-JFET transistors, P-MOS, N-MOS and D-MOS transistor components, beginning with the step of selectively forming an n+ region at the surface of a monocrystalline p-type semiconductor substrate, at each location where a vertical NPN, P-JFET, D-MOS, P-MOS or N-MOS component is to be fabricated. A monocrystalline n-type semiconductor surface layer is then formed epitaxially on said substrate covering each of the device locations. P+ regions are then selectively formed in said epitaxial layer extending therethrough to provide p-n junction isolation between adjacent component regions. A first lightly-doped p-type surface region (N-Well) is then selectively formed in the isolated portion of the epitaxial layer where P-MOS and N-MOS devices are to be fabricated. A second lightly-doped p-type region is selectively formed in the isolated portion of said epitaxial layer where D-MOS components are to be fabricated. First, second, third and fourth medium-doped p-type regions are then selectively formed constituting the vertical NPN base, the D-MOS backgate contact, the N-MOS backgate and guardring, and the P-MOS source and drain regions, respectively. N-type regions are then formed selectively and concurrently, constituting the vertical NPN collector contact, the lateral NPN collector and emitter, the N-MOS source and drain, the vertical NPN emitter, the D-MOS source and drain, the P-MOS background contact, and the P-JFET gate contact, respectively. Gate oxide is then selectively formed over the D-MOS, P-MOS and N-MOS channel regions. The P-MOS enhancement threshold voltage is then adjusted by ion implantation. Boron ions are then selectively implanted to form depletion channels for the P-MOS and P-JFET devices. The circuit is then completed by selective oxide removal to form contact vias, followed by metallization and patterning, using known techniques.

The surface dopant concentration achieved during the D-Well formation is controlled to permit the threshold voltages of N-MOS and D-MOS components to be approximately equal.

Oxide growth over P-MOS and N-MOS device regions is controlled to increase parasitic thick field N-MOS threshold, and thereby permit relatively thinner oxide growth over the D-Well channel regions. Preferably, sheet resistors are fabricated concurrently with N-Well fabrication, to provide sheet resistors having a resistance of at least 1,000 ohms per square.

The surface dopant concentration resulting from D-Well formation is controlled such that D-MOS threshold voltage is set by the intersection of emitter dopant and D-Well dopant concentration profiles.

It is also preferred to include the step of forming a modified base region for the lateral NPN component concurrently with the D-Well diffusion step.

Still further, it is preferred to include concurrently with the D-MOS gate contact region the fabrication of additional P-type regions as the N-MOS backgate contact, N-MOS guard ring and sheet resistors.

As before, the oxide mask for emitter diffusion is patterned in two stages by first selectively opening oxide windows for N-MOS source and drain, D-MOS drain, P-MOS background contact, P-JFET gate contact, and vertical and lateral NPN collector contacts, followed by a subsequent selective opening of oxide windows for the vertical and lateral NPN emitters and D-MOS source, in order to reduce oxide undercutting and thereby preserve D-MOS alignment for precision control in setting D-MOS channel length.

FIGS. 1–12 are enlarged cross sections of a semiconductor slice, serving to illustrate the sequence of process steps for the fabrication of circuits in accordance with the invention. They are generalized and do not comprehend special well known topological considerations such as field plating, optional ion implantations, and improved contact openings. For ease of illustration, all diffusions are assumed to be complete in the designated cross section; whereas in reality certain diffusions are interrupted for other implants or depositions, and may not be complete until subsequent thermal cycles are completed.

Figure 13:
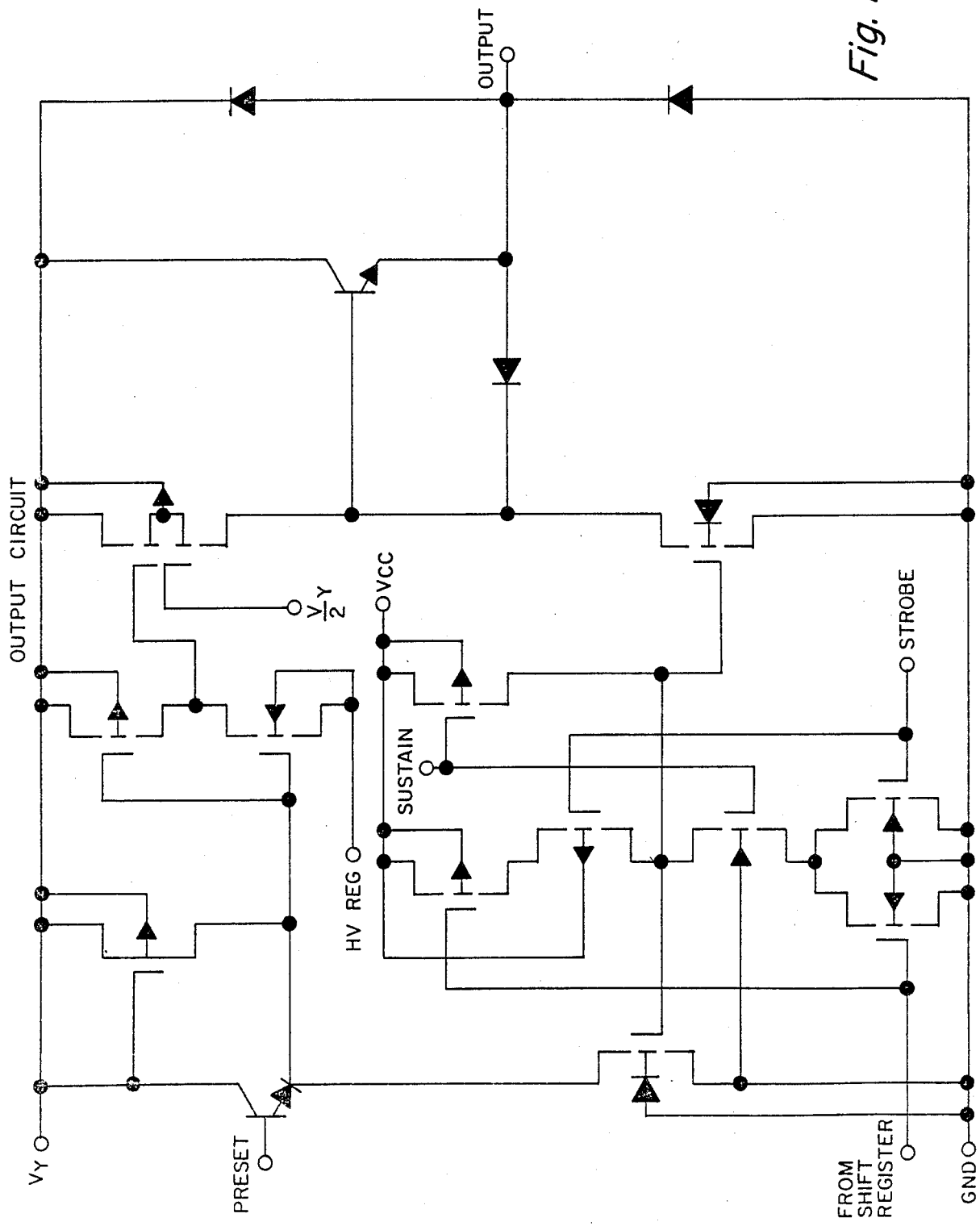
Figure 14:
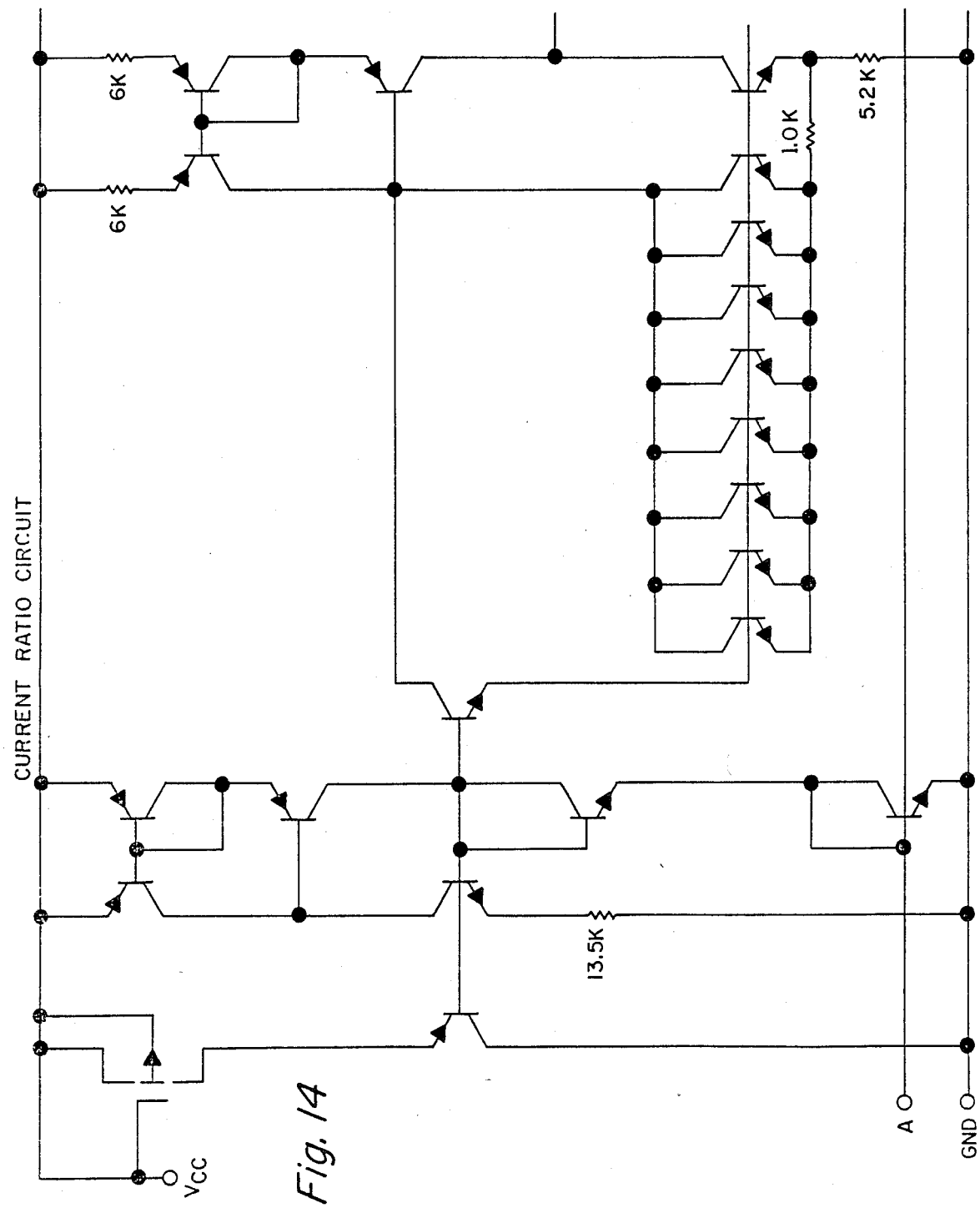
Figure 14:
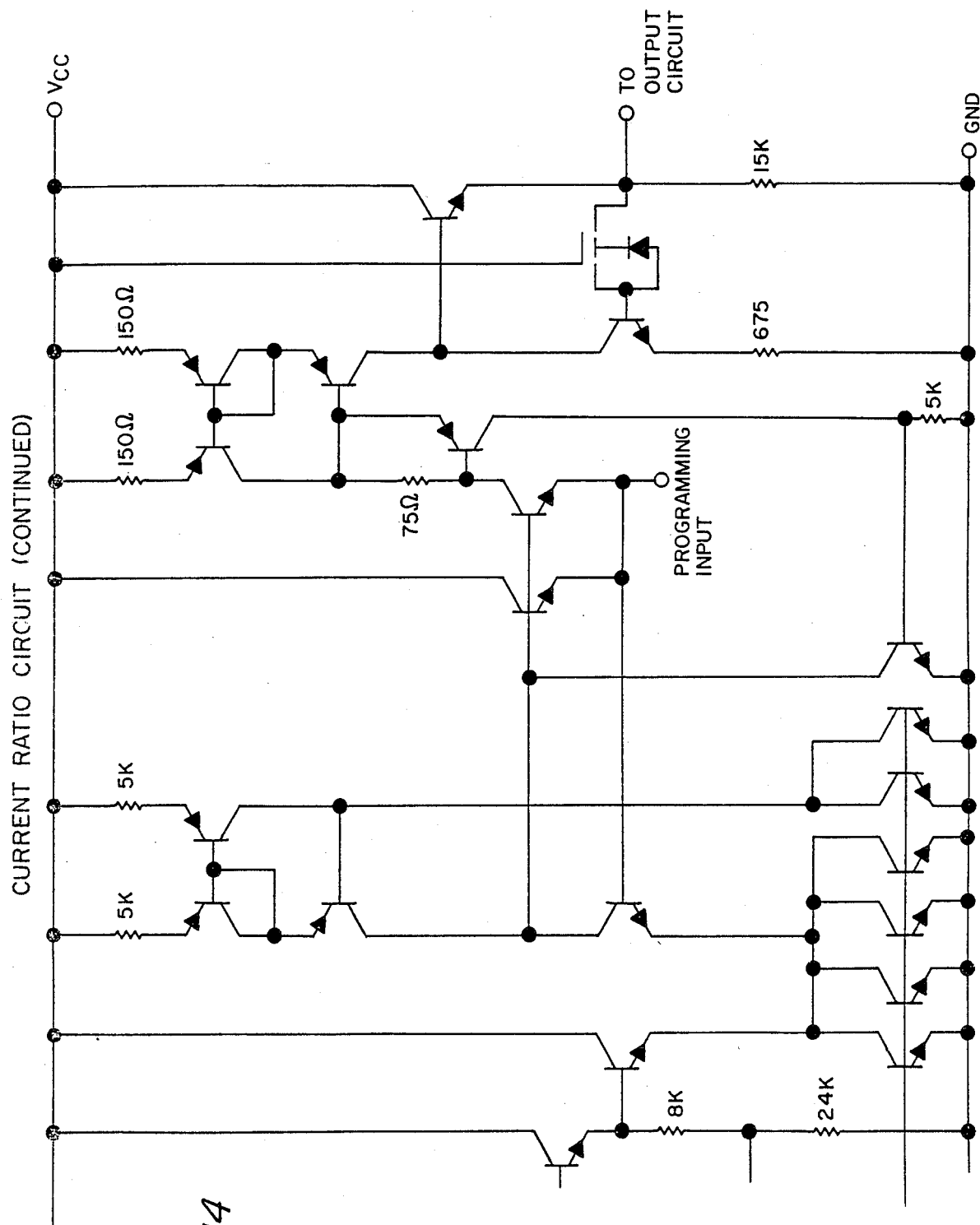
Figure 14:
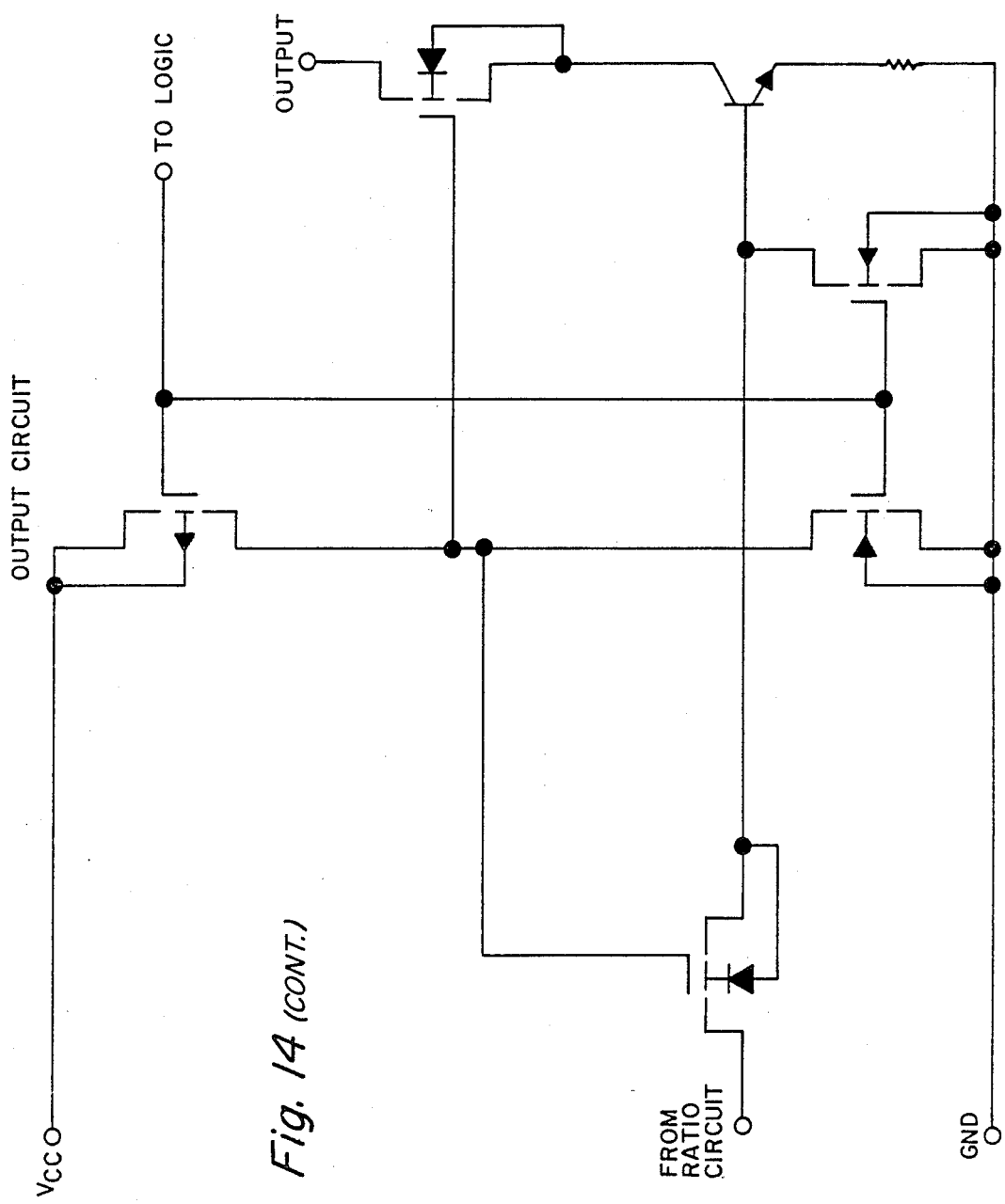

FIGS. 13 and 14 are circuit diagrams of representative applications wherein the process technology of the invention is particularly useful.

In FIG. 1 the starting slice is seen to be a monocrystalline p-type substrate of silicon having a resistivity of 3–15 ohm-cm, and preferably about 10 ohm-cm. Using known techniques for selective diffusion or implantation, n+ regions 12, 13 and 14 are formed at locations where the vertical NPN, P-JFET, P-MOS and N-MOS devices are to be completed. Optionally, n+ region 13a is also formed at D-MOS locations, to lower the distributed drain resistance of the drift region. Epitaxial layer 15 is then grown on the substrate, doped to provide n-type conductivity and a resistivity of 5.0 ohm-cm to 8.0 ohm-cm and preferably 6.5 ohm-cm. The wafer is then heated in an oxidizing atmosphere to form silicon oxide layer 16 which is then patterned to provide apertures for the formation of p+ isolation zones 17 to electrically separate the various component regions.

In FIG. 2, oxide layer 16 is provided with an aperture 18 for selective formation of an n+ region 19 which serves as the deep collector region of vertical NPN devices and is optional.

In FIG. 3, oxide layer 16 is provided with an aperture 20 for the selective formation of p- region 21 which is the N-Well wherein N-MOS devices are to be completed. The surface dopant concentration of region 21 is adjusted to about $2 \times 10^{16}/cm^3$ in order to compensate D-MOS source lateral diffusions in order to approximately match N-MOS and D-MOS threshold voltages, for example at 1.5 volts.

Independent oxide growth to a thickness greater than 8000Å is permitted over the N-Well 21 in order to increase the parasitic thick field N-MOS threshold voltage without adversely affecting D-MOS self-alignment as might occur if excessive oxide growth (>2500Å) were permitted over the D-Well.

Sheet resistors having resistance levels on the order of 1.5 thousand ohms per square may be fabricated concurrently with the formation of the N-Well diffusion. These resistors are more accurate than standard base resistors and demonstrate excellent lot to lot accuracy. Also, the sheet resistance is an order of magnitude higher than standard resistors fabricated concurrently with standard base diffusions.

Also, the fabrication of NPN transistors having 25 volt emitter-base reverse breakdown are permitted, compared to the normal 7 volts breakdown.

In FIG. 4, oxide layer 16 is provided with aperture 22 through which to form D-Well region 23. The D-Well is formed using known techniques, which preferably include the use of photolithographic techniques for selective oxide removal, followed by the implantation of boron ions and subsequent oxide removal, followed by the implantation of boron ions and subsequent thermal diffusion of the implant to generate the desired dopant concentration profile. The surface concentration of boron atoms is controlled to about $1 \times 10^{17}/cm^3$ so as to permit the D-MOS threshold voltage to be set by the intersection of emitter and D-Well profiles. The thermal distribution of boron is achieved with limited oxygen content in the gaseous ambient, in order to limit oxide growth. Only the minimum oxide thickness (~2500Å) necessary to mask the D-Well from subsequent phosphorous diffusion is permitted.

Optionally, the lateral NPN base region 25 may be formed concurrently with D-Well 23 using the same implant and diffusion. However, NPN performance is improved somewhat by providing a somewhat higher dosage of boron implant for region 25 than is optimum for region 23. Specifically, the increased doping of region 25 provides the lateral NPN transistor with increased current capability by increasing low level injection in the base region and also decreases the series based resistance. Hence, the lateral NPN base region 25, is slightly deeper than the D-Well because of the different deposition concentrations even with the identical diffusion cycle.

Figure 5:
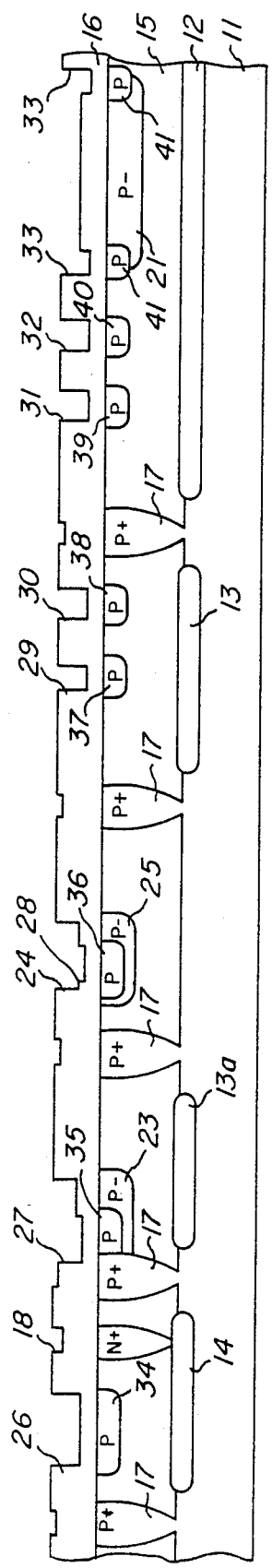
Figure 6:
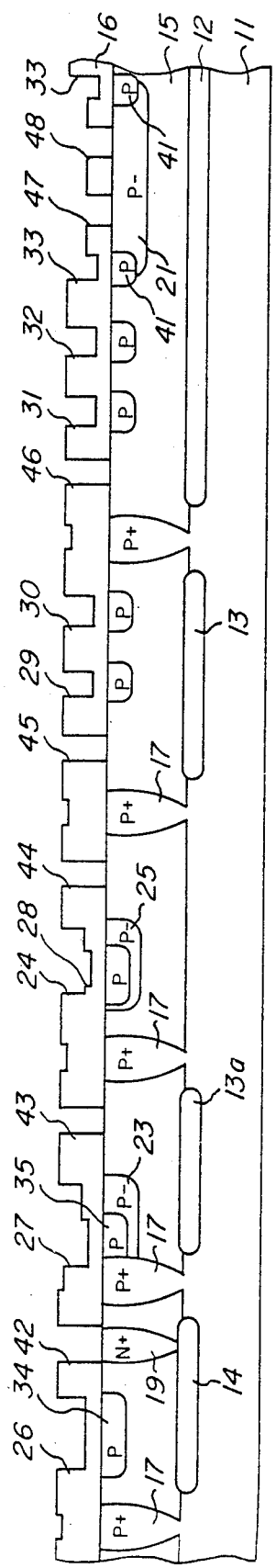

In FIG. 5, oxide layer 16 is provided with apertures 26, 27, 28, 29, 30, 31, 32, and 33 through which to form the vertical NPN base region 34, the D-MOS backgate contact region 35, the lateral NPN base region 36, the P-JFET source and drain 37 and 38, the P-MOS source and drain 39 and 40 and the N-MOS backgate contact and guardring 41, respectively. These regions are all p-type; they all receive the same deposition or implant and thermal cycling to distribute the boron deposition or implant. In FIG. 6 oxide layer 16 is provided with apertures 42, 43, 44, 45, 46, 47 and 48 through which to form the vertical NPN collector contact, the D-MOS drain region, the lateral NPN collector region, the P-JFET gate contact, the P-MOS background contact, the N-MOS source and drain. These windows are opened separately and in advance of the D-MOS source and the NPN emitter, so that the base oxide and D-Well oxide may be much thinner than the N-Well and EPI oxides. This avoids the possibility of severe undercutting on the thinner oxide which could adversely affect D-MOS self-alignment.

Figure 7:
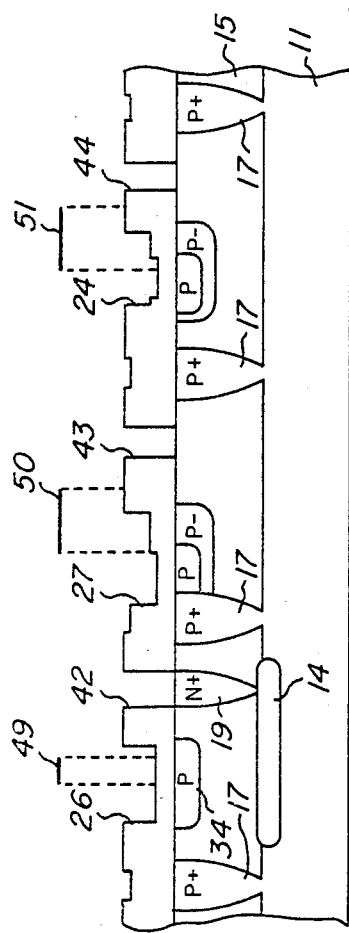

In FIG. 7, the photoresist pattern for selective opening of deposition windows for the NPN emitter and D-MOS source is shown, including the pattern for opening lateral NPN emitter. As previously noted, after the D-Well diffusion and hence the base diffusion, sufficient oxide is grown to mask the D-Well and base surfaces from the subsequent phosphorous deposition and diffusion. The emitter mask is used to open the base and D-Well oxide windows for undercutting purposes. This mask is also used to maintain D-MOS self-alignment. The pattern of the emitter mask is constrained inside the base and background regions for the respective NPN emitter and D-MOS source. The unetched oxide mask permits selective control of the emitter and source locations as the thin oxide masks all other portions of the medium doped p-type areas from the phosphorous deposition.

The emitter mask extends beyond the short channel regions in areas where a D-MOS channel is to be formed. FIG. 7 shows the emitter mask alignment after oxide removal for the D-MOS drain. Black rectangles 49, 50 and 51 indicate areas where resist is to be removed unless the oxide is to be subsequently removed. The resist is exposed with the mask and oxide removal is performed so as to just open all base and D-Well windows. In this process the oxide grown over the original D-Well cut is etched away along the original oxide cut. The overlapping of the short channel region causes the field oxide over this region to be etched back by the amount of base oxide removed. However, the remaining field oxide will mask the short channel from the source diffusion and thereby preserve the D-MOS self-alignment.

In D-MOS applications with very short channels, the emitter mask should contain only the D-MOS source oxide removal and the NPN emitter oxide removal should be contained on the D-MOS drain mask in order to further minimize undercutting.

Figure 8:
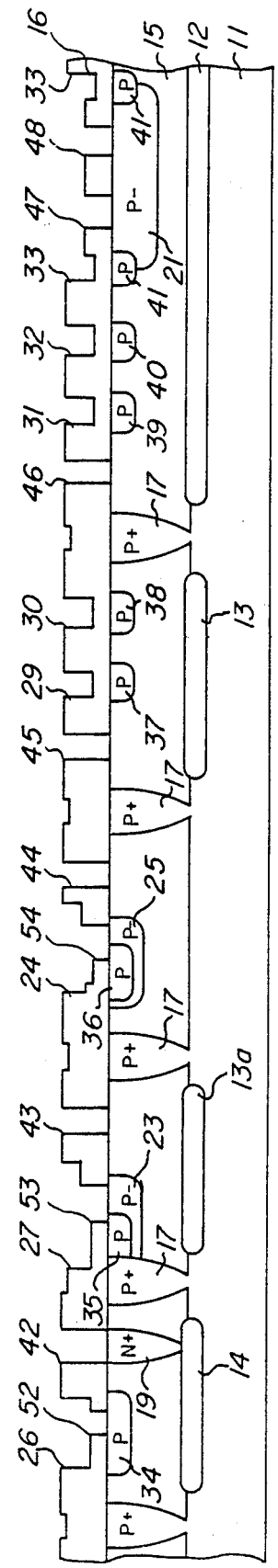
Figure 9:
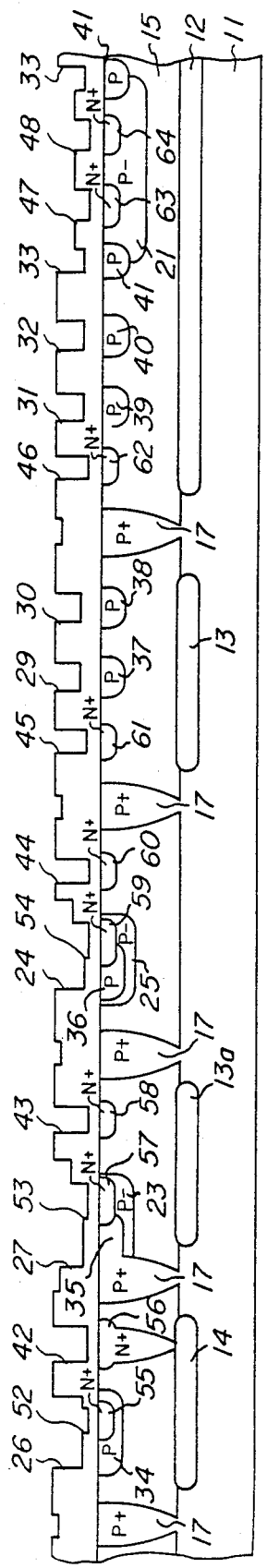
Figure 10:
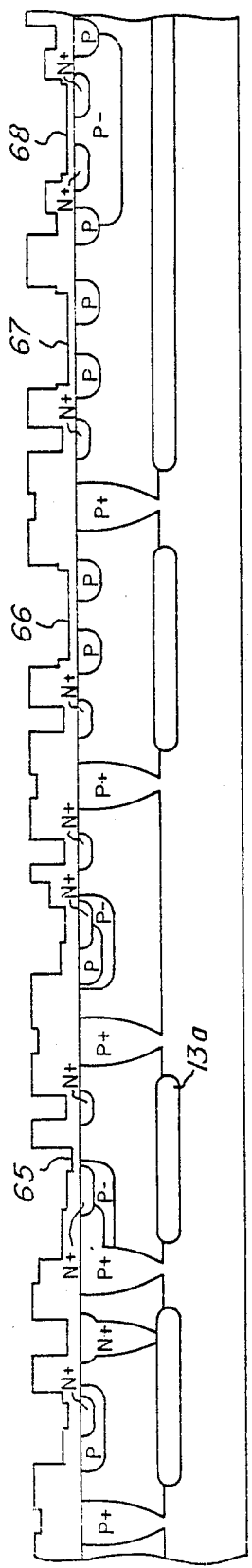

In FIG. 8, oxide layer 16 is shown after completion of apertures 52, 53, and 54 through which to form the NPN emitter, the D-MOS source and the lateral NPN emitter, respectively. The previously formed apertures 42 through 48 remain open. Thus, the complete set of apertures is now ready for phosphorous implantation or deposition and diffusion to form N+ regions 55 through 64 (FIG. 9).

The implant dosage (or deposition) and thermal diffusion is controlled so as to set the desired NPN beta, for example $h_{fe} \cong 100$. By independently presetting the D-Well dopant concentration, the D-MOS channel length is determined by the difference between the emitter and D-Well diffusions. This procedure preserves the D-MOS self-alignment and permits quasi-independent control of lateral D-MOS and vertical NPN characteristics.

In FIG. 10, oxide layer 16 is again patterned, this time to provide controlled oxide growth at locations 65 through 68, constituting the gate oxide for all MOS components and the implantation mask for setting P-JFET channel implantation.

The entire slice receives a boron implant at this stage for threshold voltage adjustment of P-MOS enhancement devices and also to provide a slight increase in the N-MOS and D-MOS threshold voltages.

Figure 11:
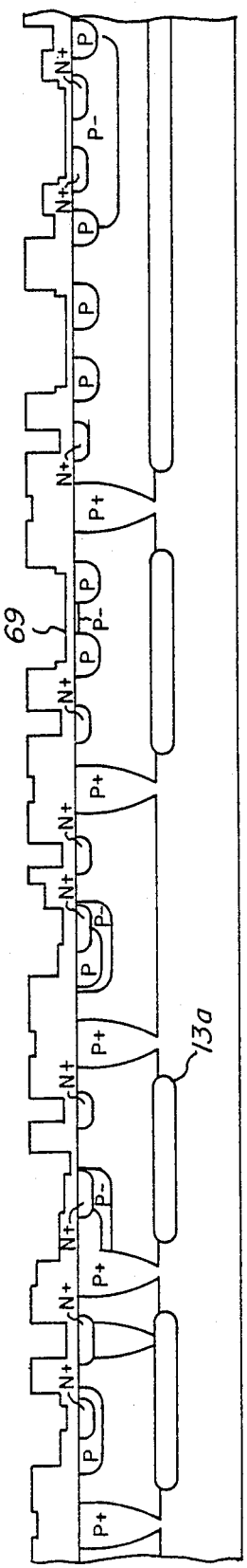
Figure 12:
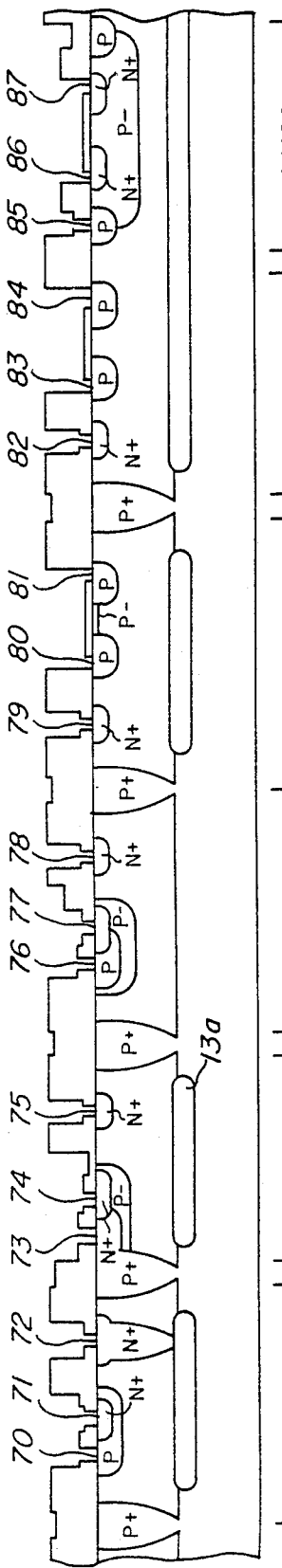

The depletion channels for P-MOS and P-JFET components are then adjusted by selective boron implants, as shown in FIG. 11. Finally, the oxide layer is again patterned as shown in FIG. 12 to open contact vias for metallization and patterning of interconnects.

FIG. 13 is an AC plasma driver circuit diagram consisting of an internal level shifter, CMOS logic gates, an output push-pull driver consisting of a tetrode P-MOS/NPN source and a DMOS sink. The circuit provides low-power high-voltage level shifting with high-speed, high-voltage, high transconductance output switching capability. Inputs are driven by low power MSI CMOS logic circuits.

FIG. 14 is a high-voltage, precision programmable current source used in applications such as a cathode driver for DC plasma displays. It consists of a bandgap regulator with emitter follower and Wilson mirrors, which provides accurate output voltage virtually independent of supply voltage range (4-15 volts) and temperature variations. By programming this voltage with a precision resistor and mirroring through another set of Wilson mirrors, the user can program analog output level. This level is then mirrored and switched by precision NPN/D-MOS elements and the cascade NPN/D-MOS output element provides virtual independence of output voltage excursions over a wide range (10-400 volts). The logic determining the output state is high per CMOS logic permitting low-power operation. Thus, this circuit provides a means of controlling an output logic state, including a programmable, precision, high-voltage analog level virtually independent of the supply voltage variation, ambient temperature variation, and output voltage variation. This circuit illustrates the merging of high performance bipolar, D-MOS and CMOS logic gates.

I claim:

1. An integrated semiconductor circuit, comprising:
    a self-aligned D-MOS transistor, having a channel region, a source and a drain on opposite sides of said channel region, and a backgate region at least partially within said channel region;
    and a vertical NPN transistor, having an emitter, a base and a collector, said NPN transistor being isolated from said D-MOS transistor to enable high performance operation thereof;
    the D-MOS transistor having a diffused dopant concentration profile in said channel region;
    the emitter of said NPN transistor being formed in a well having a diffused dopant concentration profile corresponding to said dopant concentration profile of said D-MOS transistor channel region;
    whereby said dopant concentration profiles determine the D-MOS transistor threshold voltage.

2. The integrated semiconductor circuit of claim 1 further comprising a monocrystalline p-type semiconductor substrate upon which said D-MOS and NPN transistors are formed.

3. The integrated semiconductor circuit of claim 2 further comprising a plurality of isolated regions of n-type material formed upon said substrate; and a plurality of wells of lightly doped p-type material, formed in respective ones of said regions of said n-type material in which said channel of said D-MOS transistor and said emitter of said NPN transistor are formed.

4. The integrated semiconductor circuit of claim 3 wherein said dopant is boron ions having a surface concentration of $1 \times 10^{17}/\text{cm}^3$.

5. An integrated semiconductor circuit, comprising:
    a monocrystalline p-type semiconductor substrate;
    a plurality of regions of n-type semiconductor formed upon said substrate, said regions being isolated from each other to enable high performance operation of transistor devices formed therein;
    a plurality of wells of lightly doped p-type material selectively formed within said n-type semiconductor regions;
    a self-aligned D-MOS transistor, in one of said regions, and having a channel formed in one of said wells, a source and a drain on opposite sides of said channel, and a backgate adjacent said channel away from said source and drain;
    and a vertical NPN transistor, in another of said n-type semiconductor regions, and having an emitter, a base and a collector, said base being formed in another one of said wells;
    the well in which said channel of said D-MOS transistor is formed having a diffused dopant concentration profile;
    the well in which the emitter of said NPN transistor is formed having a diffused dopant concentration profile corresponding to said dopant concentration profile of said well in which said channel of said D-MOS transistor is formed;
    whereby said dopant concentration profiles determine the D-MOS transistor threshold voltage.

* * * * *